(12) United States Patent
Phillips

(10) Patent No.: US 7,773,198 B2
(45) Date of Patent: Aug. 10, 2010

(54) FILTERED DEVICE CONTAINER ASSEMBLY WITH SHIELD FOR A RETICLE

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 842 days.

(21) Appl. No.: 11/655,674

(22) Filed: Jan. 19, 2007

(65) Prior Publication Data

US 2007/0229793 A1    Oct. 4, 2007

Related U.S. Application Data

(60) Provisional application No. 60/786,472, filed on Mar. 28, 2006.

(51) Int. Cl.
| | |
|---|---|
| G03B 27/62 | (2006.01) |
| G03B 27/52 | (2006.01) |
| G03B 27/42 | (2006.01) |
| G03F 1/00 | (2006.01) |
| B65D 85/00 | (2006.01) |

(52) U.S. Cl. ............................. 355/75; 355/30; 355/53; 430/5; 206/455

(58) Field of Classification Search .................. 355/18, 355/30, 53, 75, 77; 430/5; 414/935, 937, 414/939, 940; 206/455
See application file for complete search history.

(56) References Cited

U.S. PATENT DOCUMENTS

| | | | |
|---|---|---|---|
| 6,090,176 A | 7/2000 | Yoshitake et al. | |
| 6,153,044 A | 11/2000 | Klebanoff et al. | |
| 6,239,863 B1 | 5/2001 | Catey et al. | |
| 6,253,464 B1 | 7/2001 | Klebanoff et al. | |
| 6,281,510 B1 | 8/2001 | Yoshitake et al. | |
| 6,317,479 B1 | 11/2001 | Chiba et al. | |
| 6,619,903 B2 | 9/2003 | Friedman et al. | |
| 6,646,720 B2 | 11/2003 | Ramamoorthy et al. | |
| 6,728,332 B2 | 4/2004 | Chiba et al. | |
| 6,753,945 B2 | 6/2004 | Heerens et al. | |

(Continued)

FOREIGN PATENT DOCUMENTS

WO    WO 2006/046682    5/2006

OTHER PUBLICATIONS

*Reticle Handling Commonality* document provided by ASML during a presentation at an EUV Mask Standard meeting on Jul. 11, 2006, US.

(Continued)

*Primary Examiner*—Alan A Mathews
(74) *Attorney, Agent, or Firm*—Roeder & Broder LLP

(57) ABSTRACT

A device container assembly (30) for storing a reticle (26) includes a device container (246) and a shield assembly (250). The device container (246) encircles the reticle (26). Further, the device container (246) includes a fluid port (254) that allows for the flow of fluid (276) into and out of the device container (246). The shield assembly (250) is encircled by the device container (246). Further, the shield assembly (250) is positioned between the fluid port (254) and the reticle (26) when the reticle (26) is positioned within the device container (246). The shield assembly (250) can inhibit contaminants (278) near the fluid port (254) from being deposited on the reticle (26) and can maintain the integrity of the reticle (26).

19 Claims, 5 Drawing Sheets

U.S. PATENT DOCUMENTS

| | | |
|---|---|---|
| 6,826,451 B2 | 11/2004 | del Puerto et al. |
| 6,906,783 B2 | 6/2005 | del Puerto et al. |
| 6,912,043 B2 | 6/2005 | Galburt |
| 6,984,474 B2 | 1/2006 | Roux |
| 6,991,416 B2 | 1/2006 | del Puerto et al. |
| 7,042,554 B2 | 5/2006 | Galburt |
| 7,057,711 B2 | 6/2006 | del Puerto et al. |
| 7,123,344 B2 | 10/2006 | Van De Ven et al. |
| 7,153,612 B2 | 12/2006 | Heerens |
| 7,453,549 B2 * | 11/2008 | Suzuki et al. ............ 355/30 |
| 2003/0162101 A1 | 8/2003 | Heerens et al. |
| 2004/0180270 A1 * | 9/2004 | Heerens ............... 430/5 |
| 2006/0066834 A1 | 3/2006 | Phillips et al. |
| 2006/0087638 A1 | 4/2006 | Hirayanagi |
| 2007/0206173 A1 * | 9/2007 | Suzuki et al. ............ 355/75 |

OTHER PUBLICATIONS

U.S. Appl. No. 11/235,198, filed Sep. 27, 2005, Motoko Suzuki et al.

* cited by examiner

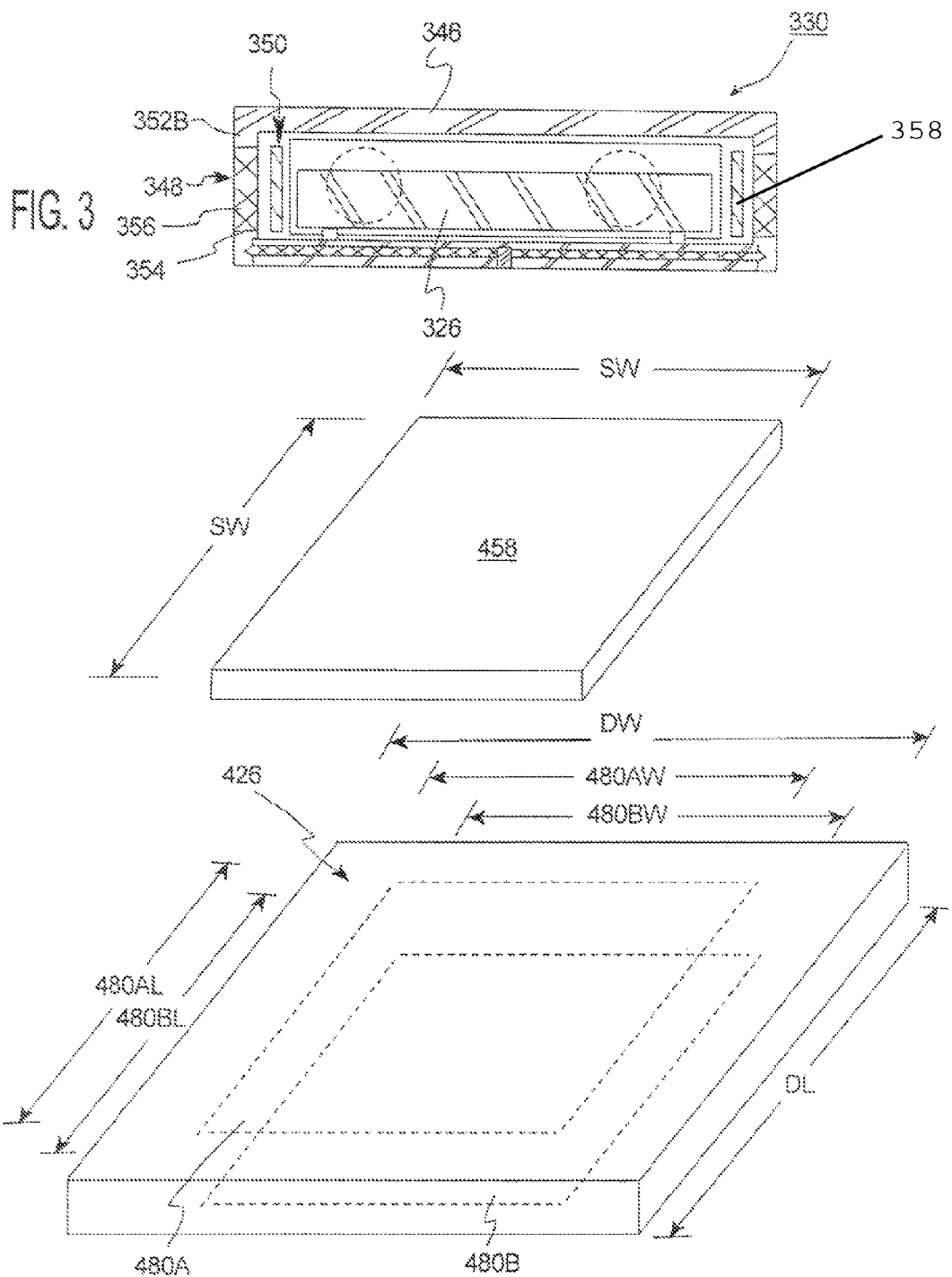

FILTERED DEVICE CONTAINER ASSEMBLY WITH SHIELD FOR A RETICLE

RELATED APPLICATION

The application claims priority on Provisional Application Ser. No. 60/786,472 filed on Mar. 28, 2006. As far as is permitted, the contents of Provisional Application Ser. No. 60/786,472 are incorporated herein by reference.

BACKGROUND

Exposure apparatuses for semiconductor processing are commonly used to transfer images from a reticle onto a semiconductor wafer. The images transferred onto the wafer from the reticle are extremely small. Unfortunately, contaminants on the reticle can influence the quality of the images that are transferred to the wafer.

SUMMARY

The present invention is directed to a device container assembly for storing a device. In one embodiment, the device container assembly includes a device container and a shield assembly. The device container encircles and encloses the device. Further, the device container includes a fluid port that allows for the flow of fluid into and out of the device container. The shield assembly is encircled and enclosed by the device container. Further, the shield assembly is positioned between the fluid port and the device when the device is positioned within the device container. With this design, in certain embodiments, the shield assembly inhibits contaminants near the fluid port from being deposited on the device. As a result thereof, the integrity of the device is maintained by the device container assembly.

In one embodiment, the shield assembly includes a shield having a shield width that is approximately equal to a device width of the device and/or a shield length that is approximately equal to a device length of the device. In another embodiment, the shield width can be greater than the device width and/or the shield length can be greater than the device length. In yet another embodiment, the shield width can be less than the device width and/or the shield length can be less than the device length. For example, the device can include a critical area having a CA width that is less than the device width, and a CA length that is less than the device length. In this embodiment, the shield width can be approximately equal to the CA width and/or the shield length can be approximately equal to the CA length.

Additionally, the device container assembly can include a filter positioned in the fluid port that filters the fluid that flows through the filter. Moreover, the device container assembly can include a plurality of spaced apart fluid ports and a plurality of corresponding filters.

Further, the present invention is directed to (i) a combination including a reticle and the device container assembly, (ii) an exposure apparatus for transferring an image to an object, and (iii) a method for manufacturing an object.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 3 is a cut-way view of another embodiment of the device container assembly and reticle;

FIG. 4 is a simplified perspective view of a reticle and a shield having features of the present invention;

DESCRIPTION

Figure 1:
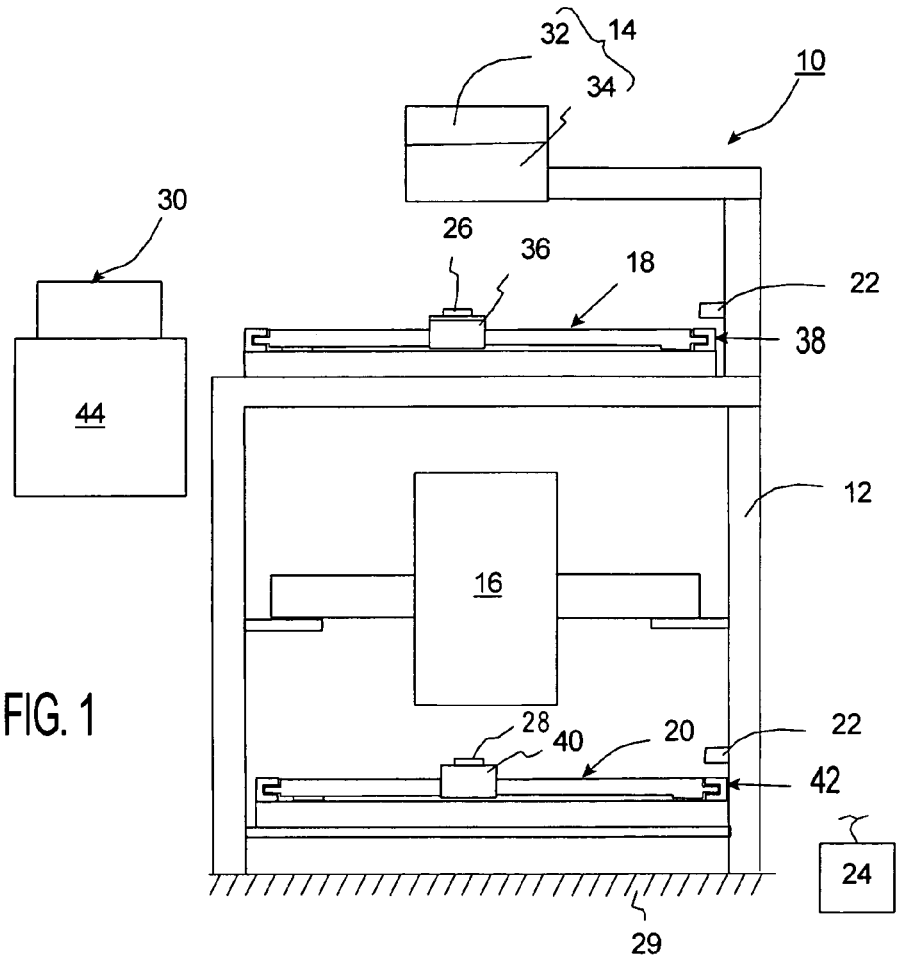
FIG. 1 is a schematic illustration of an exposure apparatus having features of the present invention.

FIG. 1 is a schematic illustration of a precision assembly, namely an exposure apparatus (lithography apparatus) 10 that includes an apparatus frame 12, an illumination system 14 (irradiation apparatus), an optical assembly 16, a first (reticle) stage assembly 18, a second (wafer) stage assembly 20, a measurement system 22, and a control system 24. The exposure apparatus 10 illustrated in FIG. 1 is particularly useful as a lithographic device that transfers a pattern (not shown) of an integrated circuit from a first device 26, e.g. a reticle onto second device 28, e.g. a semiconductor wafer. The exposure apparatus 10 mounts to a mounting base 29, e.g., the ground, a base, or floor or some other supporting structure.

FIG. 1 also illustrates a device container assembly 30 that can be used to safely store the reticle 26 when the reticle 26 is not being used. In certain embodiments, the device container assembly 30 and the reticle 26 are brought from atmospheric pressure to a vacuum when the reticle 26 is moved from storage to the exposure apparatus 10. Further, the device container assembly 30 and the reticle 26 are pressurized from a vacuum to atmospheric pressure when the reticle 26 is moved from the exposure apparatus 10 to storage. In certain embodiments, during the pressure changes, the device container assembly 30 reduces the amount of particles that are transferred to the reticle 26. As a result thereof, the integrity of the reticle 26 is maintained. The device container assembly 30 is described in more detail below.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis of the optical assembly 16 by the reticle stage assembly 18 and the wafer 28 is moved perpendicularly to the optical axis of the optical assembly 16 by the wafer stage assembly 20. Scanning of the reticle 26 and the wafer 28 occurs while the reticle 26 and the wafer 28 are moving synchronously.

Alternatively, the exposure apparatus 10 can be a step-and-repeat type lithography system that exposes the reticle 26 while the reticle 26 and the wafer 28 are stationary. In the step and repeat process, the wafer 28 is in a constant position relative to the reticle 26 and the optical assembly 16 during the exposure of an individual field. Subsequently, between consecutive exposure steps, the wafer 28 is consecutively moved with the wafer stage assembly 20 perpendicularly to the optical axis of the optical assembly 16 so that the next field of the wafer 28 is brought into position relative to the optical assembly 16 and the reticle 26 for exposure. Following this process, the images on the reticle 26 are sequentially exposed onto the fields of the wafer 28, and then the next field of the wafer 28 is brought into position relative to the optical assembly 16 and the reticle 26.

However, the use of the exposure apparatus 10 provided herein is not limited to a photolithography system for semiconductor manufacturing. For example, the exposure apparatus 10 can be a LCD photolithography system that exposes a liquid crystal display pattern from a mask onto a rectangular glass plate. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the stage assemblies 18, 20, the optical assembly 16 and the illumination system 14 above the mounting base 29.

In one embodiment, the illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam illuminates selectively different portions of the reticle 26 and exposes the wafer 28. In FIG. 1, the illumination source 32 is illustrated as being supported above the reticle stage assembly 18. Typically, however, the illumination source 32 is secured to one of the sides of the apparatus frame 12 and the energy beam from the illumination source 32 is directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm) or a $F_2$ laser (157 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open patent applications and its counterpart U.S. Pat. No. 5,668, 672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open patent applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open patent applications are incorporated herein by reference.

The reticle stage assembly 18 holds and positions the reticle 26 relative to the optical assembly 16 and the wafer 28. Somewhat similarly, the wafer stage assembly 20 holds and positions the wafer 28 with respect to the projected image of the illuminated portions of the reticle 26. The design of each stage assembly 18, 20 can be varied to suit the movement requirements of the exposure apparatus 10. In FIG. 1, the reticle stage assembly 18 includes a first (reticle) stage 36 that retains the reticle 26 and a first (reticle) mover assembly 38 that moves and positions the reticle stage 36 and the reticle 26 relative to the rest of the exposure apparatus 10. For example, the reticle mover assembly 38 can be designed to move the reticle stage 36 with three degrees of movement. Alternatively, the reticle mover assembly 38 can be designed to move the reticle stage 36 with more than three or less than three degrees of movement.

Somewhat similarly, the wafer stage assembly 20 includes a second (wafer) stage 40 that retains the wafer 28 and a second (wafer) mover assembly 42 that moves and positions the wafer stage 40 and the wafer 28 relative to the rest of the exposure apparatus 10. For example, the wafer mover assembly 42 can be designed to move the wafer stage 40 with three degrees of movement. Alternatively, the wafer mover assembly 42 can be designed to move the wafer stage 40 with more than three or less than three degrees of movement.

Each mover assembly 38, 42 can include one or more linear motors, rotary motors, voice coil motors, electromagnetic movers, planar motors, or some other type of force mover.

Further, in photolithography systems, when linear motors (see U.S. Pat. Nos. 5,623,853 or 5,528,118) are used in a first stage or a second stage, the linear motors can be either an air levitation type employing air bearings or a magnetic levitation type using Lorentz force or reactance force. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 22 monitors movement of (i) the reticle stage 36 and the reticle 26 relative to the optical assembly 16 or some other reference, and (ii) the wafer stage 40 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

The control system 24 is electrically connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

A photolithography system according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. There is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

This invention can be utilized in an immersion type exposure apparatus with taking suitable measures for a liquid. For example, PCT Patent Application WO 99/49504 discloses an exposure apparatus in which a liquid is supplied to the space between a substrate (wafer) and a projection lens system in exposure process. As far as is permitted, the disclosures in WO 99/49504 are incorporated herein by reference.

Further, this invention can be utilized in an exposure apparatus that comprises two or more substrate and/or reticle stages. In such apparatus, the additional stage may be used in parallel or preparatory steps while the other stage is being used for exposing. Such a multiple stage exposure apparatus are described, for example, in Japan Patent Application Disclosure No. 10-163099 as well as Japan Patent Application Disclosure No. 10-214783 and its counterparts U.S. Pat. No. 6,341,007, No. 6,400,441, No. 6,549,269, and No. 6,590,634. Also it is described in Japan Patent Application Disclosure No. 2000-505958 and its counterparts U.S. Pat. No. 5,969,411 as well as U.S. Pat. No. 6,208,407. As far as is permitted, the disclosures in the above-mentioned U.S. patents, as well as the Japan Patent Applications, are incorporated herein by reference.

This invention can be utilized in an exposure apparatus that has a movable stage retaining a substrate (wafer) for exposing it, and a stage having various sensors or measurement tools for measuring, as described in Japan Patent Application Disclosure 11-135400. As far as is permitted, the disclosures in the above-mentioned Japan patent application are incorporated herein by reference.

FIG. 1 also illustrates that the exposure apparatus 10 can include a device loader 44 (illustrated as a box) that can be used to move the reticle 26 between the reticle stage 36 and the device container assembly 30 and/or to open and close the device container assembly 30. For example, the device loader 44 can include one or more robotic arms (not shown) that can be controlled to perform these tasks.

Figure 2A:
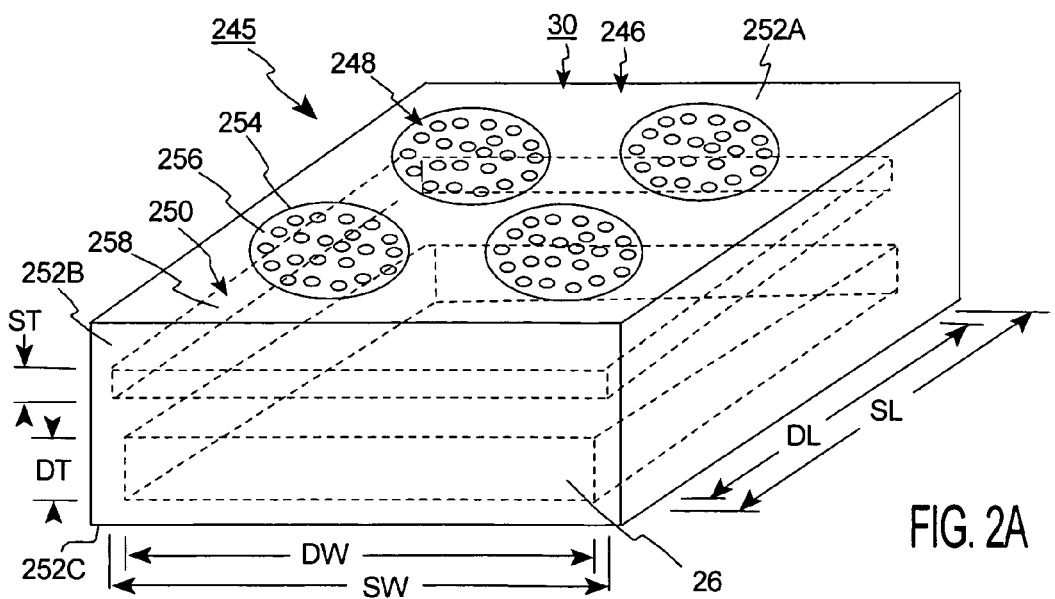
FIG. 2A is a perspective view of a combination including a device container assembly and a reticle.

FIG. 2A is a perspective view of a combination 245 that includes the device 26 (illustrated in phantom) and one embodiment of a device container assembly 30 that can be used for storing the device 26. In one embodiment, the device container assembly 30 includes a device container 246, a filter assembly 248, and a shield assembly 250 (illustrated in phantom). The design of each of these components can be varied pursuant to the teachings provided herein.

The device container 246 provides a structure for protecting the device 26 when the device 26 is not in use. The size, shape and design of the device container 246 can be varied to suit the design of the device 26. In FIG. 2A, the device 26 is a reticle that is generally rectangular shaped, has a device width "DW" of approximately 6 inches, has a device length "DL" of approximately 6 inches, and a device thickness "DT" of approximately ¼ inch. In this embodiment, the device container 246 is generally rectangular box shaped and is approximately seven inches wide, approximately seven inches in length, and approximately one inch high. Alternatively, the device container 246 can be another size and/or shape.

In FIG. 2A, the device container 246 includes a top wall 252A, four side walls 252B, and a bottom wall 252C that is opposite and spaced apart from the top wall 252A. In this embodiment, each of the walls 252A, 252B, 252C is generally flat plate shaped and is made of a rigid material. For example, suitable materials for the walls 252A, 252B, 252C include aluminum, polycarbonate, titanium, stainless steel, or acetal resin plastic sold by DuPont under the trademark Delrin.

Additionally, the device container 246 includes one or more fluid ports 254 that allow for the flow of fluid (not illustrated in FIG. 2A) into or out of the device container 246. The number, location, size and shape of fluid ports 254 can be varied to suit design of the device container 246 and the desired rate of flow of fluid into or out of the device container 246. In FIG. 2A, the device container 246 includes four spaced apart fluid ports 254. Alternatively, the device container 246 can include more than four or less than four fluid ports 254. In this embodiment, each of the fluid ports 254 is a generally circular shaped aperture that extends through the top wall 252A. Alternatively, one or more of the fluid ports 254 could have another shape or could extend through a different wall of the device container 246.

The filter assembly 248 inhibits contaminants e.g. particles, dirt and debris from entering the device container 246 when fluid is directed into and out of the device container 246. The location, size and shape of filter assembly 248 can be varied to suit design of the device container 246 and the desired rate of flow of fluid into or out of the device container 246. In FIG. 2A, the filter assembly 248 includes four spaced apart filters 256. Alternatively, the filter assembly 248 can include more than four or less than four filters 256. In this embodiment, each of the filters 256 is a generally circular shaped and is positioned in one of the fluid ports 254. For example, each of the filters 256 can have a diameter of approximately 50 millimeters. Alternatively, one or more of the filters 256 could have another size, shape or could extend through a different wall of the device container 246. In alternative, non-exclusive embodiments, one or more of the filters 256 can capture particles that are greater than approximately 20, 30, 40, or 50 nanometers.

The shield assembly 250 inhibits contaminants that are within the device container 246 from being deposited on the reticle 26. The location, size and shape of shield assembly 250 can be varied to suit the design of the device container 246 and the filter assembly 248. In FIG. 2A, the shield assembly 250 includes a single shield 258 that is positioned between the filter assembly 248 and the top of the reticle 26. Further, the shield 258 does not touch the reticle 26 and is spaced apart from the reticle 26. Alternatively, the shield assembly 250 can include multiple shields 258.

In FIG. 2A, in one embodiment, the shield 258 is a generally plate shaped and is slightly larger than the reticle 26. In this embodiment, the shield 258 has a shield width "SW" of approximately six inches, a shield length "SL" of approximately six inches in length, and a shield thickness "ST" of approximately one-sixteenth of an inch. However, other sizes of the shield 258 can be used. For example, the shield 258 can have a shield wide and/or shield length that are approximately equal to or less than that of the reticle 26.

In this embodiment, the shield 258 can be made of a rigid material. For example, suitable materials for the shield 258 can include aluminum, polycarbonate, titanium, stainless steel, or acetal resin plastic sold by DuPont under the trademark Delrin.

Figure 2B:
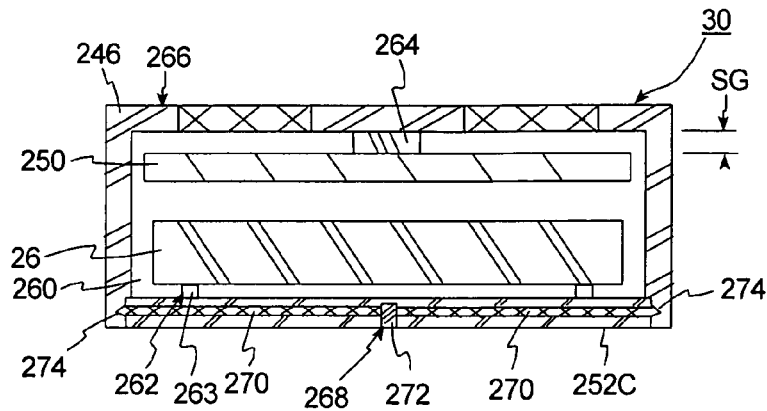
FIG. 2B is a cut-way view of the device container assembly and reticle.

FIG. 2B is a cut-away view of the device container assembly 30 and the reticle 26. FIG. 2B illustrates that the device container 246 defines a generally rectangular shaped container cavity 260 that receives the reticle 26 and the shield assembly 250. Additionally, FIG. 2B illustrates that the device container 246 can include a device retainer 262 that retains the device 26. The design of the device retainer 262 can vary. In FIG. 2B, the device retainer 262 includes three spaced apart, rectangular shaped stands 263 (only two are illustrated in FIG. 2B) that extend away from the bottom wall 252C. The stands 262 maintain the device 26 spaced apart from the bottom wall 252C. Alternatively, the device retainer 262 can have another type of design.

FIG. 2B also illustrates that the shield assembly 250 can include a shield retainer 264 that secures the shield 258 to the device container 246 and that allows for the flow of fluid between the filter assembly 248 and the shield 258. The design of the shield retainer 264 can vary. In FIG. 2B, the shield retainer 264 is generally rectangular block shaped, extends away from the top wall 252A, and maintains the shield 258 spaced apart from the top wall 252A a shield gap "SG". Non-exclusive examples of acceptable shield gaps are approximately 0.5, 1, 1.5, or 2 mm. Alternatively, the shield retainer 264 can have another type of design.

Moreover, the device container 246 can include a removable section 266 that can be selectively removed to allow for the device 26 to be removed from the device container 246. The design of the removable section 266 can vary. In FIG. 2B, the top wall 252A and the four side walls 252B make up the removable section 266 that can be removed from the bottom wall 252C.

In one embodiment, the device container 246 includes a latch 268 that selectively latches the removable section 266 to the rest of the device container 246. The design of the latch 268 can vary. In FIG. 2B, the latch 268 includes a pair of opposed lock pins 270, a pin mover 272 (illustrated as a square), and a pair of slots 274. In this embodiment, rotation of the pin mover 272 in one direction causes both lock pins 270 to move outward so that the lock pins 270 engage the corresponding slots 274 in the removable section 266 to secure the removable section 266 to the bottom wall 252C. Further, rotation of the pin mover 272 in the opposite direction causes both lock pins 270 to move inward so that the lock pins 270 do not engage the corresponding slots 274 in the removable section 266 and the removable section 266 can be moved away from the bottom wall 252C.

Figure 2C:
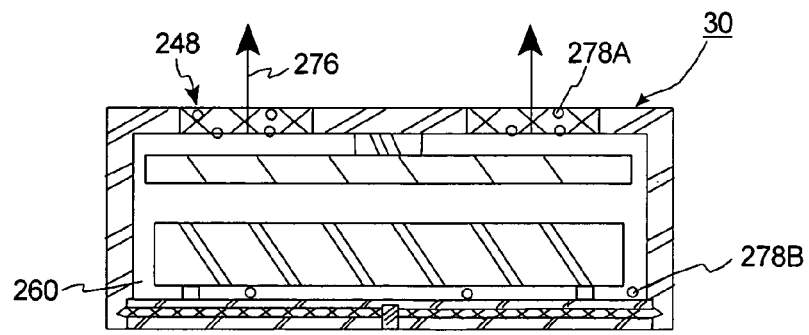
FIGS. 2C and 2D are cut-way views of the device container assembly and reticle that illustrate fluid flow.
Figure 2D:
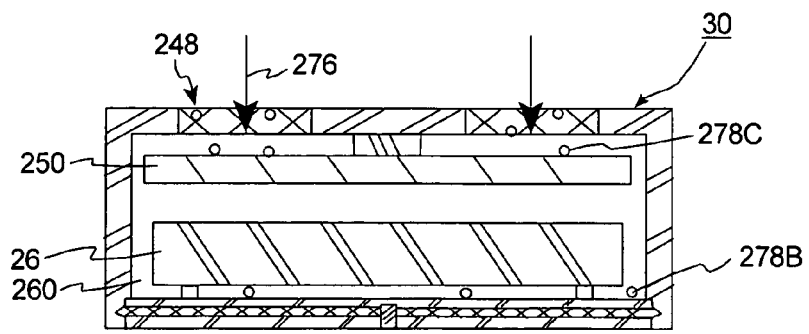

FIGS. 2C and 2D illustrate use of the device container assembly 30 in more detail. More specifically, FIG. 2C illustrates the flow of fluid 276 (illustrated as arrows) out of the container cavity 260 via filter assembly 248. For example, fluid 276 can flow out of the container cavity 260 when the device container assembly 30 is subjected to a vacuum. During the flow of fluid 276 out of the container cavity 260, some of the contaminants 278A (illustrated as circles) within the container cavity 260 can be pulled into the filter assembly 248. Other contaminants 278B (illustrated as circles) remain in the container cavity 260.

FIG. 2D illustrates the flow of fluid 276 into the container cavity 260 via filter assembly 248. For example, fluid 276 can flow into the container cavity 260 when the device container assembly 30 is brought back to atmospheric pressure from a vacuum. During the flow of fluid 276 into the container cavity 260, some of the contaminants 278C (illustrated as circles) that were previously pulled into the filter assembly 248 can be released back into the container cavity 260. In certain embodiments, the shield assembly 250 blocks the dislodged contaminants 278C and inhibits the dislodged contaminants 278C from contacting the reticle 26.

FIG. 3 is a cut-away view of another embodiment of a device container assembly 330 that can be used for storing the device 326. In one embodiment, the device container assembly 330 again includes the device container 346, the filter assembly 348, and the shield assembly 350. However, in this embodiment, the fluid ports 354 extend through the side walls 352B. Further, in FIG. 3, the filter assembly 348 includes eight spaced apart filters 356 (not all are illustrated in FIG. 3 and some are illustrated in phantom), with two spaced apart filters 356 being positioned in each of the side walls 352B.

Moreover, the shield assembly 350 includes four shields 358 (only three are illustrated) that are positioned between the filters 356 and the device 326. In this embodiment, each of the shields 358 is generally rectangular plate shaped and extends substantially parallel to one of the respective side walls 352B. Alternatively, for example, the shield assembly 350 can include eight separate shields 358.

FIG. 4 is a simplified perspective view of the reticle 426 and another embodiment of the shield 458. FIG. 4 illustrates that the reticle 426 includes an upper critical area 480A (illustrated in dashed lines) and a lower critical area 480B (illustrated in dashed lines) that contain the patterns that are being transferred. In this embodiment, (i) the upper critical area 480A has an upper critical area width 480AW that is less than the device width DW, and an upper critical area length 480AL that is less than the device length DL, and (ii) the lower critical area 480B has a lower critical area width 480BW that is less than the device width DW, and a lower critical area length 480BL that is less than the device length DL. In one embodiment, the upper critical area 480A is approximately 104 mm by 132 mm, and the lower critical area 480B is approximately 142 mm by 142 mm.

In this embodiment, (i) the shield width SW can be approximately equal to the upper critical area width 480AW, and/or (ii) the shield length SL can be approximately equal to the upper critical area length 480AL. Further, in this embodiment, the shield 458 has a shield width SW that is less than the device width DW and a shield length SL that is less than the device length DL. With this design, the shield 458 is able to protect the critical areas of the reticle 426.

Figure 5A:
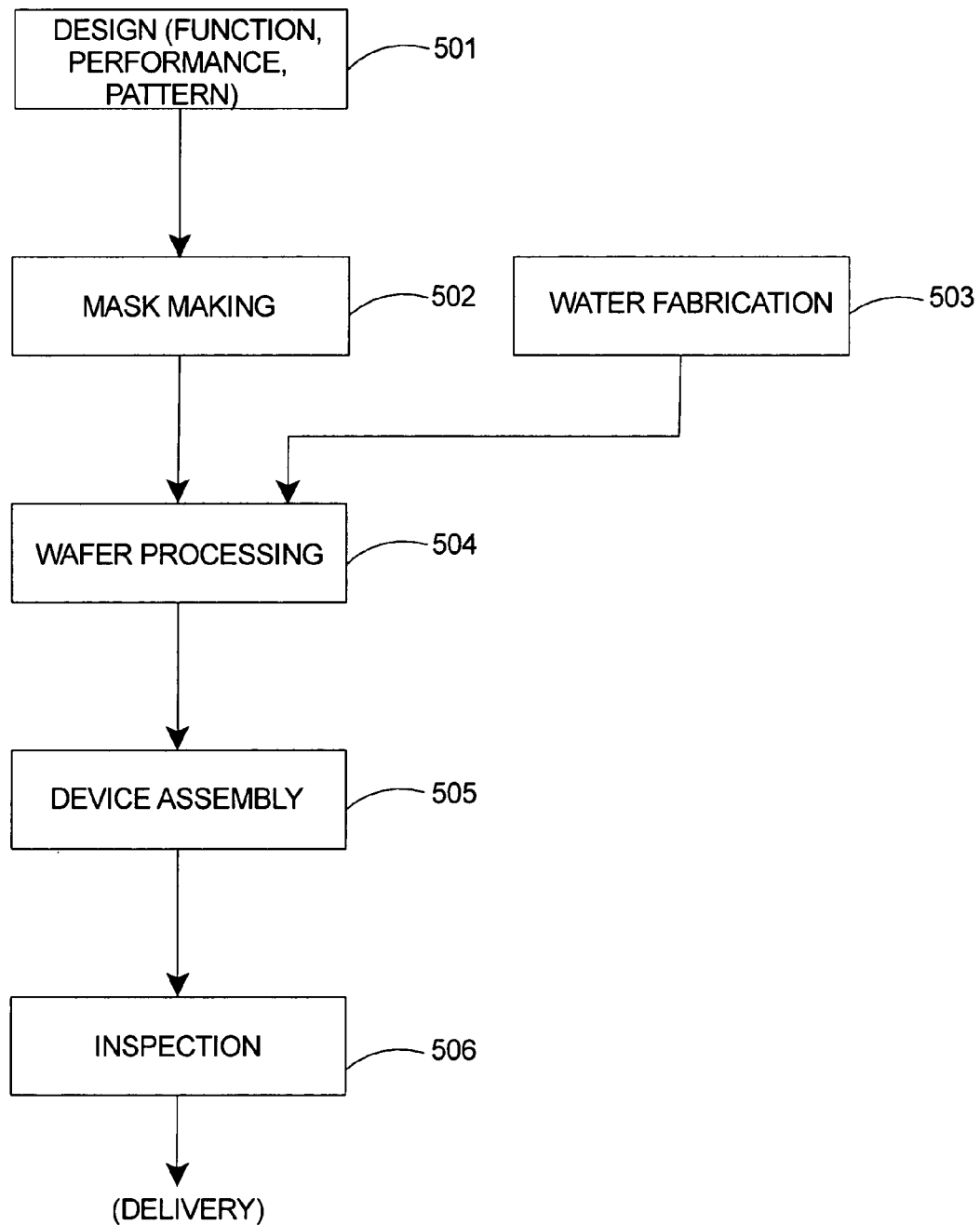
FIG. 5A is a flow chart that outlines a process for manufacturing an object in accordance with the present invention.

Further, semiconductor devices can be fabricated using the above described systems, by the process shown generally in FIG. 5A. In step 501 the device's function and performance characteristics are designed. Next, in step 502, a mask (reticle) having a pattern is designed according to the previous designing step, and in a parallel step 503 a wafer is made from a silicon material. The mask pattern designed in step 502 is exposed onto the wafer from step 503 in step 504 by a photolithography system described hereinabove in accordance with the present invention. In step 505, the semiconductor device is assembled (including the dicing process, bonding process and packaging process), finally, the device is then inspected in step 506.

Figure 5B:
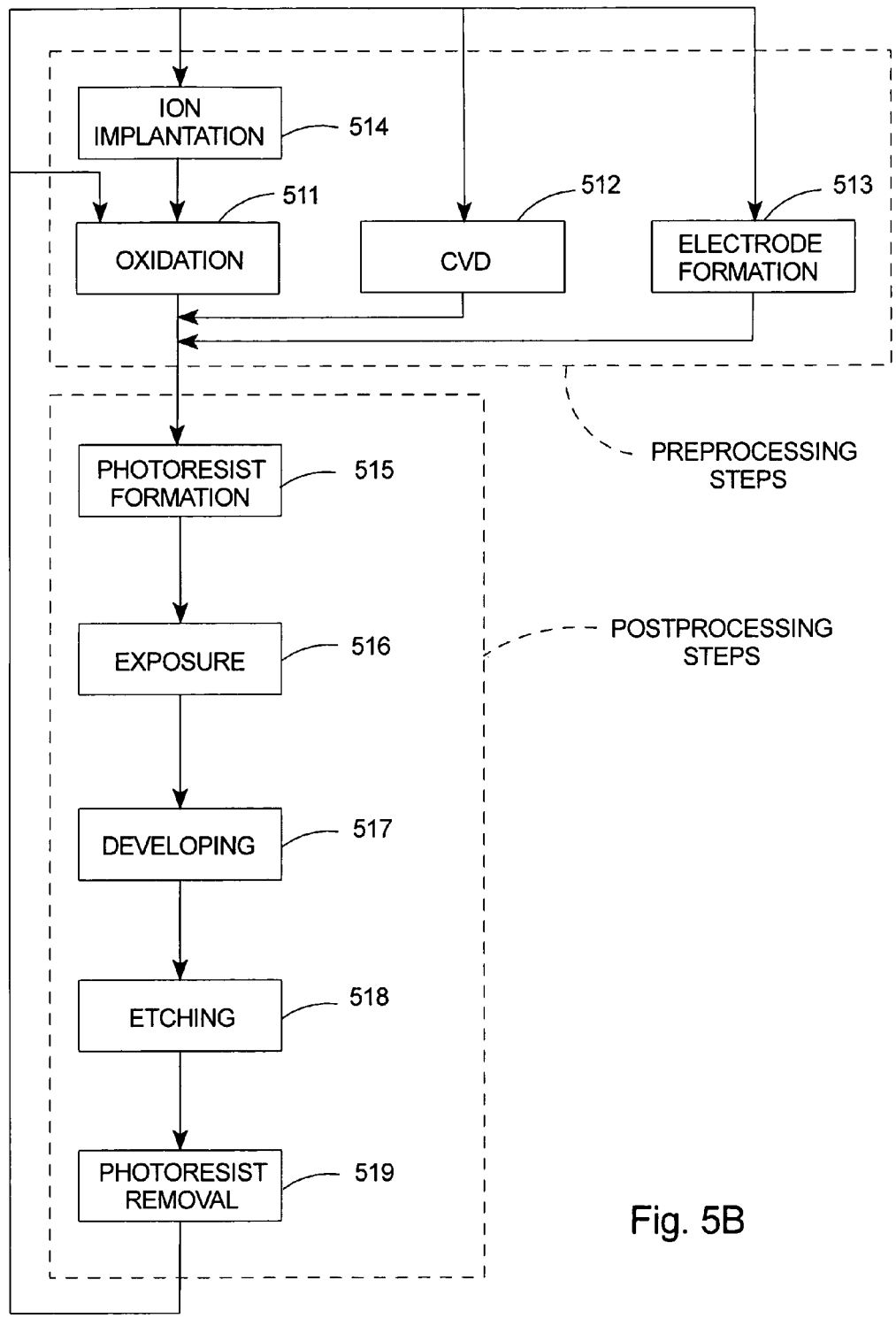
FIG. 5B is a flow chart that outlines object processing in more detail.

FIG. 5B illustrates a detailed flowchart example of the above-mentioned step 504 in the case of fabricating semiconductor devices. In FIG. 5B, in step 511 (oxidation step), the wafer surface is oxidized. In step 512 (CVD step), an insulation film is formed on the wafer surface. In step 513 (electrode formation step), electrodes are formed on the wafer by vapor deposition. In step 514 (ion implantation step), ions are implanted in the wafer. The above mentioned steps 511-514 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 515 (photoresist formation step), photoresist is applied to a wafer. Next, in step 516 (exposure step), the above-mentioned exposure device is used to transfer the circuit pattern of a mask (reticle) to a wafer. Then in step 517 (developing step), the exposed wafer is developed, and in step 518 (etching step), parts other than residual photoresist (exposed material surface) are removed by etching. In step 519 (photoresist removal step), unnecessary photoresist remaining after etching is removed.

Multiple circuit patterns are formed by repetition of these preprocessing and post-processing steps.

While the particular assembly as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A device container assembly for storing a device, the device container assembly comprising:
   a device container that encircles the device, the device container including a fluid port that allows for the flow of fluid through a portion of the device container; and
   a shield assembly that is encircled by the device container, the shield assembly being positioned between and spaced apart from the fluid port and the device when the device is positioned within the device container, wherein the shield assembly is secured to the device container.

2. The device container assembly of claim 1 wherein the device includes a critical area, and the shield assembly includes a shield having a shield width that is approximately equal to a critical area width of the device.

3. The device container assembly of claim 2 wherein the shield has a shield length that is approximately equal to a critical area length of the device.

4. The device container assembly of claim 1 wherein the shield assembly includes a shield having a shield width that is greater than a device width of the device.

5. The device container assembly of claim 4 wherein the shield has a shield length that is greater than a device length of the device.

6. The device container assembly of claim 1 further comprising a filter positioned in the fluid port that filters the fluid that flows through the filter.

7. The device container assembly of claim 1 wherein the shield is positioned above a top surface of the device.

8. A combination including a reticle and the device container assembly of claim 1 storing the reticle.

9. An exposure apparatus for transferring an image to an object, the exposure apparatus comprising, the combination of claim 8, a reticle stage assembly that positions the reticle, and a reticle loader that moves the reticle between the device container and the reticle stage assembly.

10. A method for manufacturing an object, the method comprising the steps of providing a substrate, and transferring an image to the substrate with the exposure apparatus of claim 9.

11. A device container assembly for storing a device including a device top, the device container assembly comprising:
   a device container that encircles the device, the device container including a plurality of fluid ports that allow for the flow of fluid through a portion of the device container;
   a filter assembly including a plurality of filters that are positioned in the fluid ports, the filter assembly filtering fluid that flows through the filter assembly;
   a shield assembly that is encircled by the device container, the shield assembly being positioned between the filter assembly and the device top of the device when the device is positioned within the device container, wherein the shield assembly is secured to the device container.

12. The device container assembly of claim 11 wherein the shield assembly includes a shield having a shield width that is approximately equal to a device width of the device and the shield has a shield length that is approximately equal to a device length of the device.

13. The device container assembly of claim 11 wherein the shield assembly includes a shield having a shield width that is greater than a device width of the device and the shield has a shield length that is greater than a device length of the device.

14. A combination including a reticle and the device container assembly of claim 11 storing the reticle.

15. An exposure apparatus for transferring an image to an object, the exposure apparatus comprising, the combination of claim 14, a reticle stage assembly that positions the reticle, and a reticle loader that moves the reticle between the device container and the reticle stage assembly.

16. A method for manufacturing an object, the method comprising the steps of providing a substrate, and transferring an image to the substrate with the exposure apparatus of claim 15.

17. A method for storing a device, the method comprising the steps of:
   enclosing the device in a device container, the device container including a fluid port that allows for the flow of fluid through a portion of the device container;

filtering the fluid with a filter that is positioned in the fluid port;

positioning a shield in the device container between and spaced apart from the filter and the device; and securing the shield to the device container.

18. The method of claim 17 wherein the step of positioning a shield includes positioning a shield having a shield width that is approximately equal to a device width of the device, and a shield length that is approximately equal to a device length of the device.

19. A method for transferring an image to a substrate, the method comprising the steps of storing the device by the method of claim 17, providing a reticle stage assembly that positions the device, moving the device between the device container and the reticle stage assembly with a device loader, and irradiating the device to transfer the image to the substrate.

* * * * *